(12) United States Patent
Kudo

(10) Patent No.: US 10,445,639 B2
(45) Date of Patent: Oct. 15, 2019

(54) MACHINE LEARNING APPARATUS

(71) Applicant: KABUSHIKI KAISHA TOSHIBA, Tokyo (JP)

(72) Inventor: Kiwamu Kudo, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 605 days.

(21) Appl. No.: 15/228,314

(22) Filed: Aug. 4, 2016

(65) Prior Publication Data

US 2017/0039472 A1 Feb. 9, 2017

(30) Foreign Application Priority Data

Aug. 4, 2015 (JP) ................................ 2015-154138

(51) Int. Cl.
*G06N 3/08* (2006.01)
*G06N 3/063* (2006.01)
*G11C 11/16* (2006.01)

(52) U.S. Cl.
CPC .............. *G06N 3/063* (2013.01); *G11C 11/16* (2013.01)

(58) Field of Classification Search
CPC .................................................... G06N 3/049
See application file for complete search history.

(56) References Cited

U.S. PATENT DOCUMENTS

| 8,897,047 | B2 | 11/2014 | Bourianoff et al. |
| 9,418,720 | B1 | 8/2016 | Kudo |
| 2016/0260467 | A1 | 9/2016 | Kudo |

FOREIGN PATENT DOCUMENTS

| JP | 2010-205023 | 9/2010 |
| JP | 2016-162976 | 9/2016 |
| JP | 2016-162978 | 9/2016 |

OTHER PUBLICATIONS

K L Wang et al., "Low-power non-volatile spintronix memory: STT-RAM and beyond" 2013 J. Phys. D: Appl. Phys. 46 074003 (Year: 2013).*

Shibata et al., "CMOS Supporting Circuitries for Nano-Oscillator-Based Associative Memories," 2012 13th International Workshop on Cellular Nanoscale Networks and their Applications, Aug. 29-31, 2012 (Year: 2012).*

(Continued)

*Primary Examiner* — Li B. Zhen
*Assistant Examiner* — Scott R Gardner
(74) *Attorney, Agent, or Firm* — Finnegan, Henderson, Farabow, Garrett & Dunner, L.L.P.

(57) ABSTRACT

According to an embodiment, a machine learning apparatus includes an interlayer accelerator. The interlayer accelerator includes interlayer units that generate, based on (a) an input vector of a first layer included in a neural network that includes three or more layers and (b) a learning weight matrix of the first layer, an input vector of a second layer next to the first layer. Each of the interlayer units includes a coupled oscillator array. The coupled oscillator array includes oscillators that oscillate at frequencies corresponding to differences between elements of the input vector of the first layer and elements of a row vector that is one row of the learning weight matrix, and combines oscillated signals generated by the oscillators to obtain a calculated signal.

6 Claims, 6 Drawing Sheets

(56) References Cited

OTHER PUBLICATIONS

Deliang Fan, "Boolean and Brain-Inspired Computing Using Spin-Transfer Torque Devices," (2015), Purdue University Open Access Dissertations, 1186. Submitted and approved no later than Jul. 17, 2015 (Year: 2015).*

LeCun, Y. et al. (May 2015). "Deep learning," *Nature*, vol. 521, pp. 436-444.

Nikonov, D. et al. (Sep. 2014). "Convolutional Networks for Image Processing by Coupled Oscillator Arrays," arXiv:1409.4469v1; pp. 1-23.

Shibata, T. et al. "CMOS Supporting Circuitries for Nano-Oscillator-Based Associative Memories," *2012 13th International Workshop*, Aug. 20-31, 2012; 6 pages.

* cited by examiner

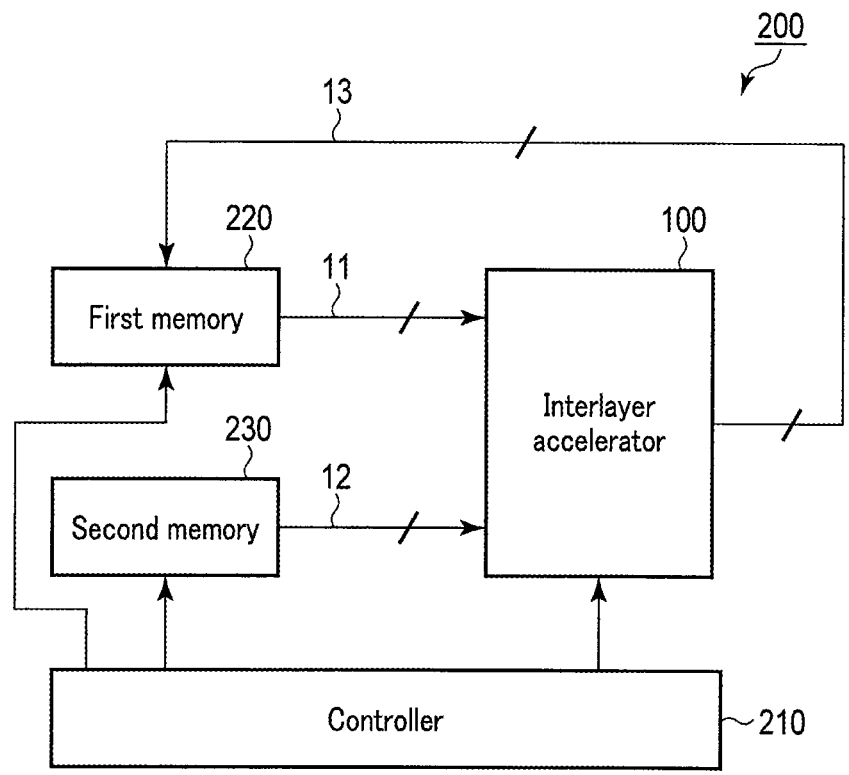
F I G. 2
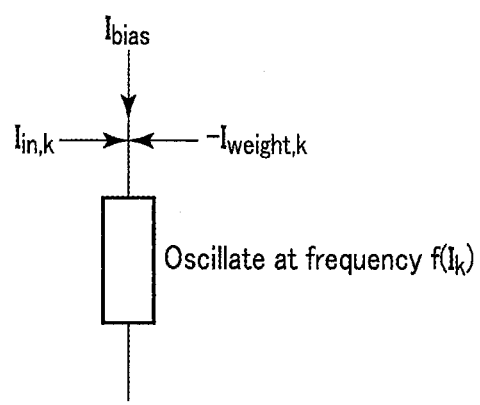
F I G. 3

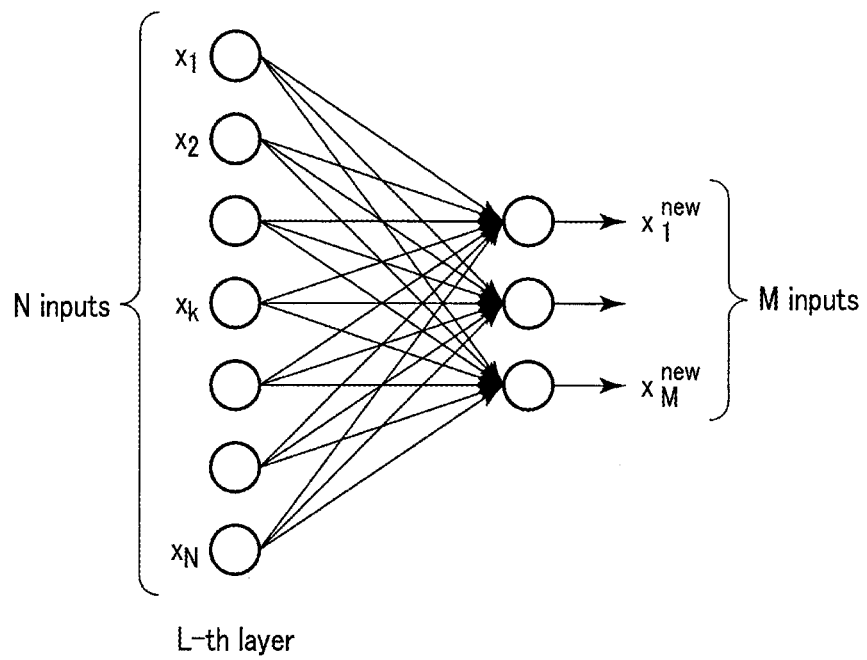
F I G. 4
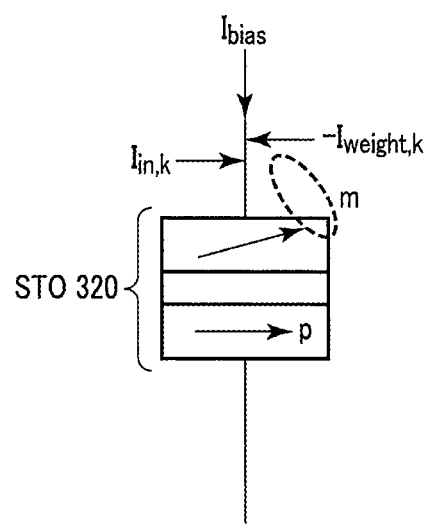
F I G. 5

MACHINE LEARNING APPARATUS

CROSS-REFERENCE TO RELATED APPLICATIONS

This application is based upon and claims the benefit of priority from Japanese Patent Application No. 2015-154138, filed Aug. 4, 2015, the entire contents of which are incorporated herein by reference.

FIELD

Embodiments relate to machine learning.

BACKGROUND

In recent years, deep learning using a multilayer neural network has drawn attention in the machine learning field. Deep learning has been expected to greatly contribute to the development in neural network-related technology, and is considered to have triggered the third artificial intelligence boom. Deep learning allows a neural network to semi-automatically obtain various feature expressions, and does not require the designer to devise a method for extracting a feature amount. In the future, a mobile device, such as a smartphone, an autonomous robot, or a drone, may be enabled to take intellectual and self-motivated actions by applying deep learning to the mobile device.

The multilayer neural network used in deep learning is typically implemented by making a computer server including a CPU (Central Processing Unit), a memory, and a GPU (Graphic Processing Unit) execute a program (code). The GPU included in the computer server is also called an accelerator, and can enhance the speed of the execution of the program by utilizing parallelism of the GPU. In addition, distributed learning using a plurality of GPUs is performed for further enhancement of the speed of the deep-learning process.

In the multilayer neural network, an input vector of a layer is multiplied by a learning weight matrix, and an input vector of the next layer is generated based on the product (which is a vector). Such an interlayer matrix product calculation is frequently performed, and its calculation cost is high.

For example, a deep learning neural network for image recognition, which has been successful in recent years, includes stacked multiple convolution layers and a fully connected layer near an output layer, and matrix product calculations account for most of the calculation cost in the convolution layer and fully connected layer. In a DNN (Deep Neural Network)-HMM (Hidden Markov Model) hybrid model, which is widely used for speech recognition, the DNN part includes multiple fully connected layers which use matrix product calculations.

On the whole, matrix product calculations account for most of the calculation cost in deep learning. Therefore, the aforementioned deep learning implemented by using a computer server enhances its speed by using a matrix product calculation library tuned for a GPU.

The GPU serving as an accelerator greatly contributes to enhancement of the speed of the deep learning, but installing it on a mobile device is unrealistic. For example, the size of the GPU installed on a computer server (>25 cm×10 cm×3 cm) is much larger than that of a common smartphone, and the weight thereof is not less than 1 kg. In addition, operating one GPU requires as much power as 200 W.

BRIEF DESCRIPTION OF THE DRAWINGS

FIG. 2 is a block diagram showing the machine learning apparatus according to the first embodiment.

FIG. 3 is an explanatory diagram of an operation of the oscillator in FIG. 1.

FIG. 4 is an explanatory diagram of an interlayer matrix product calculation in a multilayer neural network.

FIG. 5 is an explanatory diagram of an operation of a spin torque oscillator used by an interlayer accelerator included in a machine learning apparatus according to the second embodiment.

DETAILED DESCRIPTION

Figure 1:
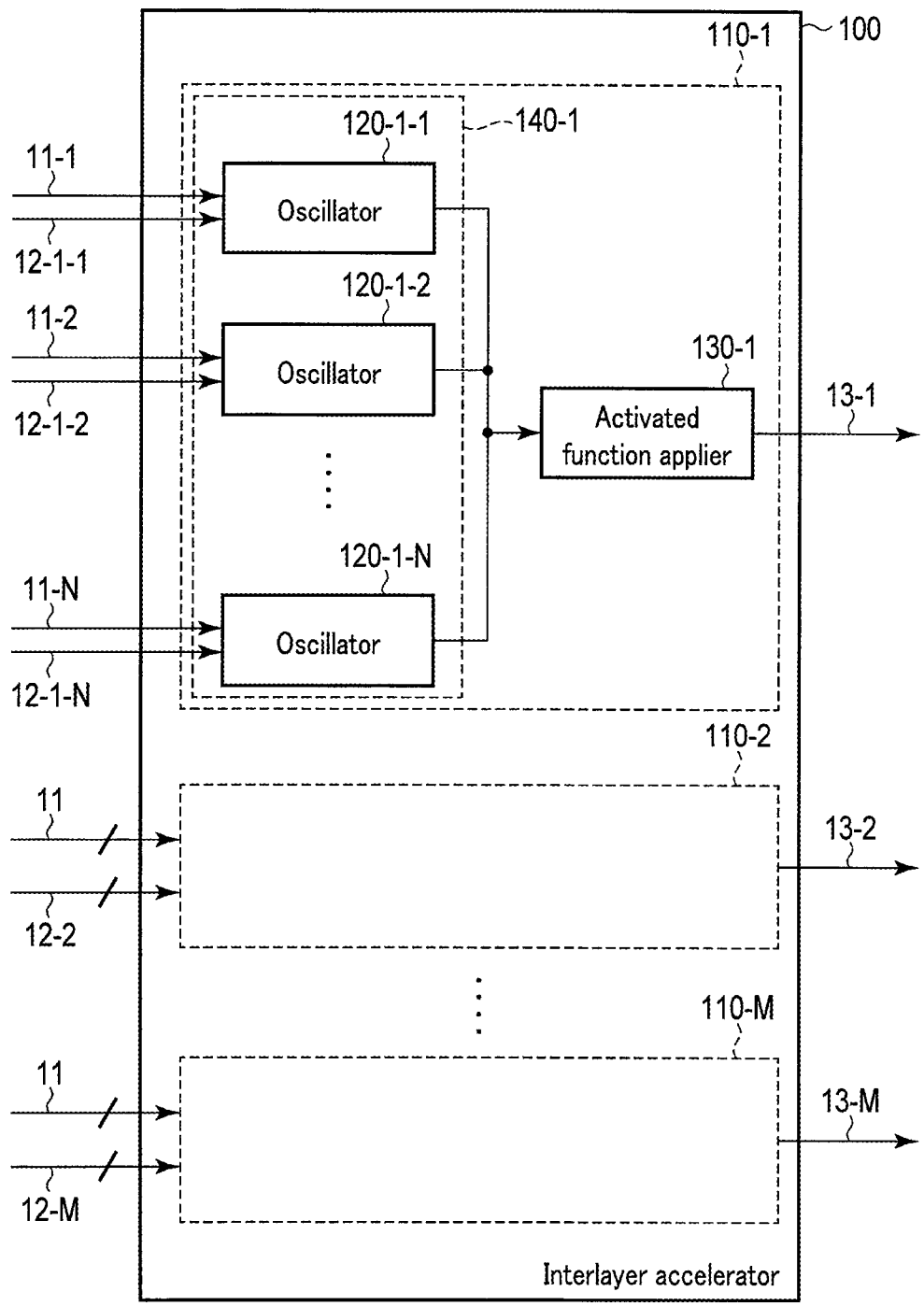
FIG. 1 is a block diagram illustrating an interlayer accelerator included in a machine learning apparatus according to the first embodiment.

Hereinafter, embodiments will be described with reference to drawings.

According to an embodiment, a machine learning apparatus includes an interlayer accelerator. The interlayer accelerator includes a plurality of interlayer units that generate, based on (a) an input vector of a first layer included in a neural network that includes three or more layers and (b) a learning weight matrix of the first layer, an input vector of a second layer next to the first layer. Each of the plurality of interlayer units includes a coupled oscillator array and an activation function applier. The coupled oscillator array includes a plurality of oscillators that oscillate at frequencies corresponding to differences between a plurality of elements of the input vector of the first layer and a plurality of elements of a row vector that is one row of the learning weight matrix, and combines oscillated signals generated by the plurality of oscillators to obtain a calculated signal. The activation function applier applies an activation function to the calculated signal to generate one element of the input vector of the second layer.

Hereinafter, the elements which are the same as or similar to those previously described are assigned with the same or similar reference numerals or symbols, and redundant descriptions will basically be omitted. For example, when there are a plurality of identical or similar elements, a common reference numeral or symbol may be used for explanations without distinction between the elements, and branch numerals or symbols may be used in addition to the common reference numeral or symbol for explanations to distinguish between each element.

First Embodiment

A machine learning apparatus according to the first embodiment performs deep learning (also called a multilayer neural network or deep neural network) task processing. Since the multilayer neural network includes an input layer, one or more hidden layers, and an output layer, the number (P) of the layers is three or more in total.

The machine learning apparatus according to the present embodiment performs multilayer neural network task processing at high speed by using an interlayer accelerator 100 illustrated in FIG. 1. The interlayer accelerator 100 of FIG. 1 includes a plurality of interlayer units 110. Each interlayer unit 110 receives an input vector 11 (X) of an L-th layer, and a row vector (hereinafter referred to as a learning weight vector) corresponding to a row included in a learning weight matrix 12 (W) of the L-th layer, and generates one element (i.e., an input value of one neuron included in the (L+1)-th layer) of an input vector 13 of the (L+1)-th layer based on the received vectors.

Elements of each vector may be normalized in accordance with the type of data handled in the multilayer neural network to which the interlayer accelerator 100 of FIG. 1 is applied. For example, when image data is handled, elements of each vector are normalized so that 8-bit gradations (i.e., 256 values) can be expressed.

In general, the matrix product calculation (see FIG. 4) that intermediates between the L-th layer and the (L+1)-th layer (L is an integer not less than 1 and not more than (P−1)) of the multilayer neural network can be expressed by the following formula (1):

$$WX = X^{new}$$

$$\begin{bmatrix} w_{11} & w_{12} & \ldots & w_{1N} \\ w_{21} & w_{22} & \ldots & w_{2N} \\ \vdots & \vdots & \ddots & \vdots \\ w_{M1} & w_{M2} & \ldots & w_{MN} \end{bmatrix} \begin{bmatrix} x_1 \\ x_2 \\ \vdots \\ x_N \end{bmatrix} = \begin{bmatrix} x_1^{new} \\ x_2^{new} \\ \vdots \\ x_M^{new} \end{bmatrix} \quad (1)$$

In formula (1), W represents the learning weight matrix 12 of the L-th layer, X represents the input vector 11 of the L-th layer, $X^{new}$ represents a product (vector) of W and X, and M and N represent a row number and a column number of the learning weight matrix.

The matrix product calculation can be broken down into a plurality of vector dot product calculations. For example, the matrix product calculation of formula (1) is broken down into total M vector dot product calculations of the input vector 11 and learning weight vector. A dot product a·b of given vectors a and b can be calculated based on formula (2), below:

$$a \cdot b = |a||b|\cos\theta \quad (2),$$

where |•| represents magnitude of a vector, and θ represents an angle formed by vectors a and b. When the magnitude of each of vectors a and b is normalized to one, the dot product a·b equals cos θ. Cos θ is the maximum (1) when the absolute value of θ is 0[rad] (i.e., when vectors a and b have the same direction), steadily decreases as the absolute value of θ increases, and is the minimum (−1) when the absolute value of θ is π[rad] (i.e., when vectors a and b have opposite directions). Accordingly, the vector dot product is a type of a degree of similarity between two vectors.

The interlayer accelerator 100 performs, at high speed, substitute calculations capable of obtaining a degree of similarity between two vectors, instead of performing vector dot product calculations constituting a matrix product calculation. Specifically, each interlayer unit 110 included in the interlayer accelerator 100 calculates a degree of similarity between an input vector 11 (X) and a learning weight vector as will be described later, instead of calculating a dot product thereof, thereby generating one element of vector $X^{new}$.

As illustrated in FIG. 1, the interlayer unit 110 includes a coupled oscillator array 140 and an activation function applier 130.

The coupled oscillator array 140 includes a plurality of oscillators 120 that (simultaneously) oscillate at frequencies corresponding to differences between a plurality of elements of the input vector 11 and those of the learning weight vector. In other words, the coupled oscillator array 140 encodes the input vector 11 and the learning weight vector as a frequency shift of the plurality of oscillators 120. The coupled oscillator array 140 combines oscillated signals generated by the plurality of oscillators 120 to obtain a calculated signal. For example, the oscillated signals may be averaged through capacitive coupling. The coupled oscillator array 140 outputs the calculated signal to the activation function applier 130.

The oscillator 120 may be a current controlled oscillator that oscillates at a frequency (f(I)≠const.) corresponding to an input current (I). In this case, the input current ($I_k$) of oscillator 120-$l$-$k$ (l is a given integer not less than one and not more than M) that handles the k-th element (k is a given integer not less than one and not more than N) is $I_{bias}$+ ($I_{in,k}$−$I_{weight,k}$), as illustrated in FIG. 3. $I_{bias}$ represents a bias current, $I_{in,k}$ represents a current corresponding to the k-th element of the input vector 11, and $I_{weight,k}$ represents a current corresponding to the k-th element of the learning weight vector. The correspondence (e.g., conversion equation) between the k-th element of the input vector 11 and $I_{in,k}$ is designed to match the correspondence between the k-th element of the learning weight vector and $I_{weight,k}$. Therefore, if the k-th element of the input vector 11 equals the k-th element of the learning weight vector, oscillator 120-$k$ oscillates at frequency f($I_{bias}$) regardless of the magnitudes of $I_{in,k}$ and $I_{weight,k}$ themselves. The input current (I) is designed to fall within the range where f(I) steadily increases or monotonically decreases relative to I. The oscillator 120 may be a voltage controlled oscillator or another controllable oscillator.

The calculated signal output by the coupled oscillator array 140 represents a degree of similarity between the input vector 11 and the learning weight vector. Specifically, the amplitude of the calculated signal represents a matching degree between a plurality of elements of the input vector 11 and a plurality of elements of the learning weight vector. If all the elements of the input vector 11 match the corresponding elements of the learning weight vector, the oscillated signals are perfectly synchronized, and the matching degree becomes maximum. If some elements of the input vector 11 do not correspond to the corresponding elements of the learning weight vector, the oscillated signals are not perfectly synchronized, and the matching degree becomes smaller than the maximum value.

The coupled oscillator array 140 may be a frequency shift keying (FSK) coupled oscillator array disclosed in "Convolutional Networks for Image Processing by Coupled Oscillator Arrays", Dmitri E. Nikonov, Ian A. Young, George I. Bourianoff, arXiv:1409.44 69v1, for example.

The activation function applier 130 receives the calculated signal from the coupled oscillator array 140. The activation function applier 130 generates one element of the input vector 13 of the (L+1)-th layer by applying an activation function to the calculated signal. The activation function may be determined in accordance with the configuration of the multilayer neural network to which the interlayer accelerator 100 of FIG. 1 is applied, and may be, for example, a rectified linear unit (ReLU) or a sigmoid function.

A machine learning apparatus 200 including such an interlayer accelerator 100 is illustrated in FIG. 2. The machine learning apparatus 200 of FIG. 2 includes an interlayer accelerator 100, a controller 210, a first memory 220, and a second memory 230.

The controller 210 performs various control for performing deep learning by executing a program created by a designer, for example.

Specifically, the controller 210 may control the number of interlayer units 110 to operate in the interlayer accelerator 100 for the interlayer calculation that intermediates between the L-th layer and the (L+1)-th layer. For example, when the total number of the interlayer units 110 included in the interlayer accelerator 100 exceeds the row number (M) of the learning weight matrix 12 of the L-th layer, the controller 210 may determine that the number of interlayer units 110 to operate is M.

Moreover, the controller 210 may control the number of oscillators 120 to simultaneously oscillate in the coupled oscillator array 140 in the interlayer unit 110 operated for the interlayer calculation that intermediates between the L-th layer and the (L+1)-th layer. For example, when the total number of oscillators included in the coupled oscillator array 140 exceeds the column number (N) of the learning weight matrix 12 of the L-th layer, the controller 210 may determine that the number of oscillators to simultaneously oscillate is N.

In addition, the controller 210 may control input signals of the oscillators 120 to simultaneously oscillate for the interlayer calculation that intermediates between the L-th layer and the (L+1)-th layer. For example, the controller 210 may read an input vector 11 from the first memory 220, and broadcast it to M interlayer units 110-1, 110-2, . . . , and 110-M. Similarly, the controller 210 may read M row vectors produced by decomposing the learning weight matrix from the second memory 230, and supply them to M interlayer units 110-1, 110-2, . . . , and 110-M, respectively.

Accordingly, the controller 210 can make the interlayer accelerator 100 perform a given interlayer calculation in a given multilayer neural network by executing an appropriate program and controlling various parameters (such as the number of interlayer units 110 to operate, oscillators 120 to simultaneously oscillate, and input signals of the oscillators 120). However, if hardware of the interlayer accelerator 100 is designed to comply with a desired multilayer neural network configuration, the parameters need not be controlled. Namely, the controller 210 may be omitted.

In addition, the controller can make each interlayer unit 110 perform a similarity calculation of the input vector 11 and the learning weight vector by one command by making an appropriate number (N) of oscillators 120 simultaneously operate (oscillate) in each interlayer unit 110. Namely, the speed of the multilayer neural network task processing can be enhanced. In contrast, making the GPU perform a dot product calculation of the input vector 11 and the learning weight vector requires more commands. Specifically, the dot product calculation includes a summation calculation. Making the GPU perform the summation calculation "1+2+3+ 4+5+6+7+8=36" requires at least three commands. Even if a sufficient number of threads are simultaneously operated by using a parallelization technique such as "reduction," it is impossible to make the GPU perform the dot product calculation by one command.

The similarity calculation and applications of the activation function in different interlayer units 110 are independent from one another, and the operations can be parallelized. By parallelizing the similarity calculation and applications of the activation function, a plurality of elements of the input vector 13 of the (L+1)-th layer can be concurrently generated. Namely, the speed of the multilayer neural network task processing can be enhanced. For example, the controller 210 can make the interlayer accelerator 100 by one command perform a calculation similar to the matrix product calculation (calculation in formula (1)) of the input vector 11 and the learning weight matrix 12 by making an appropriate number (M) of interlayer units 110 simultaneously operate.

In the first memory 220, the input vector 11 of the L-th layer is stored. In the first memory 220, the input vector 13 of the (L+1)-th layer calculated by the interlayer accelerator 100 may also be stored.

In the second memory 230, the learning weight matrix 12 of the L-th layer is stored. In current large-scale deep neural networks, the total data size of learning weight is in the range between several GB and 100 GB. The second memory 230 is preferably a non-volatile memory. The learning weight is updated for every learning in a learning process, but is no longer frequently updated once the learning process has ended. By storing learning weight in the (local) non-volatile memory serving as the second memory 230, the performance time of the multilayer neural network task processing can be reduced in comparison with the case where the learning weight is loaded from an external storage every time. When making the machine learning apparatus 200 learn, publicly-known techniques, such as conventional backpropagation, stochastic gradient descent (SGD), and dropout, may be used.

As described above, the machine learning apparatus according to the first embodiment uses, in a multilayer neural network, an interlayer unit that includes a plurality of oscillators that oscillate at frequencies corresponding to differences between a plurality of elements of the input vector of the L-th layer and a plurality of elements of a row vector corresponding to one row of the learning weight matrix of the L-th layer to perform a calculation similar to a dot product calculation of the input vector and the row vector at high speed. In addition, this machine learning apparatus can perform a calculation similar to the matrix product calculation of the input vector of the L-th layer and the learning weight matrix of the L-th layer by operating a plurality of interlayer units in parallel. Accordingly, this machine learning apparatus can enhance the speed of the multilayer neural network task processing.

Second Embodiment

The machine learning apparatus according to the second embodiment has a configuration in which a spin torque oscillator (STO) 320 is adopted as the oscillator 120 in the interlayer accelerator 100 of FIG. 1.

The STO 320 includes a magnetization free layer, a spacer, and a magnetization fixed layer, and has a basic configuration similar to that of the so-called magnetoresistive memory cell. The oscillating frequency of the STO 320 is can be controlled by the dc current flowing through it and the external magnetic field acting on it.

Specifically, when the STO 320 is electrified, a spin transfer effect (spin torque) is generated and free layer magnetization m starts precessional movement. The STO 320 oscillates at a frequency corresponding to the precessional movement. Since the time required from the electrification of the STO 320 to the oscillation is approximately several nanoseconds, the coupled oscillator array 140 including a plurality of STOs 320 can perform a similarity calculation of the input vector 11 and the learning weight vector at high speed (in approximately several nanoseconds).

The STO 320 is a nonlinear oscillator that oscillates at a frequency (f(I)≠const.) corresponding to an input current (I). The input current ($I_k$) of STO 320-*l*-*k* that handles the k-th element is $I_{bias}+(I_{in,k}-I_{weight,k})$ as illustrated in FIG. 5.

The STO 320 is an oscillator of a submicron size. Therefore, adopting the STO 320 as the oscillator 120 included in the interlayer accelerator 100 of FIG. 1 enables implementation of the interlayer accelerator 100 in a small size. For example, when ten million neurons are implemented, which is a considerably-large number in comparison with the current multilayer neural network technology, the total required number of the STOs 320 can be estimated as follows. If one STO 320 functions as one neuron, the interlayer accelerator 100 includes ten million STOs 320. Since different interlayer calculations are performed at different times, each STO 320 can be repeatedly operated multiple times, practically. By operating each STO 320 repeatedly, the required number of STOs can be reduced. For example, if each STO 320 is operated five times on average, the required number of STOs is one-fifth the number required when each STO 320 is not repeatedly operated.

As described above, the STO 320 has a basic configuration similar to that of the magnetoresistive memory cell, so its size can be evaluated based on, for example, $6F^2$, which is a design rule for a perpendicular magnetic spin transfer torque magnetoresistive memory (STT-MRAM). Assuming that the cell size F of the STO 320 is 20 nm, the size of ten million STOs 320 can be estimated by the following formula (3):

$$6 \times (20 \times 10^{-9})^2 \times 10^7 = (40\sqrt{15} \times 10^{-6})^2 \quad (3)$$

$$\approx (154.9 \times 10^{-6})^2$$

Accordingly, ten million STOs 320 can be contained in an approximately 155 μm square chip. This size is much smaller than the size of the GPU (>25 cm×10 cm×3 cm).

As described above, the machine learning apparatus according to the second embodiment includes an interlayer accelerator including an STO as an oscillator. This machine learning apparatus can be implemented in a smaller size than the machine learning apparatus using a GPU as an accelerator.

Third Embodiment

The machine learning apparatus according to the third embodiment has a configuration in which an STO 320 is adopted as the oscillator 120 in the interlayer accelerator 100 of FIG. 1, and a magnetoresistive random access memory (MRAM) 430 is adopted as the second memory 230 in the machine learning apparatus 200 of FIG. 2.

The MRAM 430 is a non-volatile memory. Therefore, if the learning process has already ended, by storing the learning weight in the (local) MRAM 430, the performance time of the task processing can be reduced in comparison with the case where the learning weight is loaded every time from an external storage to the MRAM 430.

Furthermore, since the STO 320 and the MRAM 430 have similar basic configurations, both being made of a magnetic material multi-layer film, they can be manufactured by similar manufacturing processes. Therefore, as illustrated in FIG. 6, the STO 320 and the MRAM 430 can be formed on the same chip (hereinafter referred to as a "hybrid chip").

Figure 6:
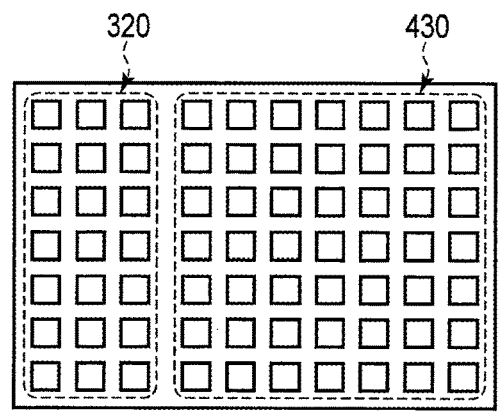
FIG. 6 illustrates a hybrid chip included in a machine learning apparatus according to the third embodiment.

When a 100 GB-size learning weight is stored in the MRAM 430, which is a considerably-large size in comparison with the present multilayer neural network technology, the total size of a part occupied by the MRAM 320 of the hybrid chip of the STO 320 and the MRAM 430 as shown in FIG. 6 can be estimated as follows:

Each MRAM cell included in the MRAM 430 stores one-bit of information. Thus, the required number of MRAM cells is $8 \times 100 \times 10^9$. When the above-mentioned $6F^2$ design rule is used while assuming the cell size F of the MRAM 430 is 20 nm, the size of the MRAM 430 that stores the 100 GB-size learning weight is estimated by the following formula (4):

$$6 \times (20 \times 10^{-9})^2 \times 8 \times 100 \times 10^9 = (8\sqrt{30} \times 10^{-3})^2 \quad (4)$$

$$\approx (43.8 \times 10^{-3})^2$$

Accordingly, the MRAM 430 that stores the 100 GB-size learning weight (eight hundred billion MRAM cells) can be contained in an approximately 4.4 cm square chip. In addition, the size of ten million STOs 320 is much smaller than that of the MRAM 430. Therefore, the entire hybrid chip as shown in FIG. 6 can be contained in a square as small as a 4.5 cm square. This size is much smaller than the size of the GPU (>25 cm×10 cm×3 cm).

As described above, the machine learning apparatus according to the third embodiment includes a hybrid chip of STOs and an MRAM. This machine learning apparatus can be implemented in a smaller size than the machine learning apparatus using a GPU as an accelerator.

Fourth Embodiment

The machine learning apparatus according to the fourth embodiment has a configuration in which an STO 320 is adopted as the oscillator 120 in the interlayer accelerator 100 of FIG. 1, and an MRAM 430 is adopted as the second memory 230 in the machine learning apparatus 200 of FIG. 2. In the machine learning apparatus, each STO 320 is surrounded by a plurality of (e.g., eight) MRAM cells, as illustrated in FIG. 7.

The capacity of the eight MRAM cells is one byte in total, and one-byte of information can express 256 values. The pixel value of grayscale image data and that of each RGB component of color image data are typically one byte. Therefore, the number of MRAM cells required for storing each element when such information is used as a learning weight is eight. Accordingly, eight MRAM cells are necessary and sufficient to store a pixel value of grayscale image data or that of each RGB component of color image data as a learning weight. The eight MRAM cells may store not only the one-byte pixel value, but also various types of learning weights in various sizes (up to one byte).

Each of the eight MRAM cells stores one bit of a learning weight expressed by one byte, and generates a magnetic field corresponding to stored information. Namely, the leak fields (stray fields) of the eight MRAM cells vary depending on the value of the learning weight stored in the respective MRAM cells. The oscillation frequency of the STO 320 changes under the influence of the external magnetic field as well as the current. Therefore, providing eight MRAM cells storing a learning weight around the STO 320 enables the controller 210 to input the learning weight to the STO 320 by using the stray fields without loading the learning weight (i.e., to shift the oscillation frequency of the STO 320 in accordance with the learning weight). Accordingly, the speed of the multi-layer neural network task processing can be enhanced in the sense that Von Neumann bottleneck is resolved.

Figure 7:
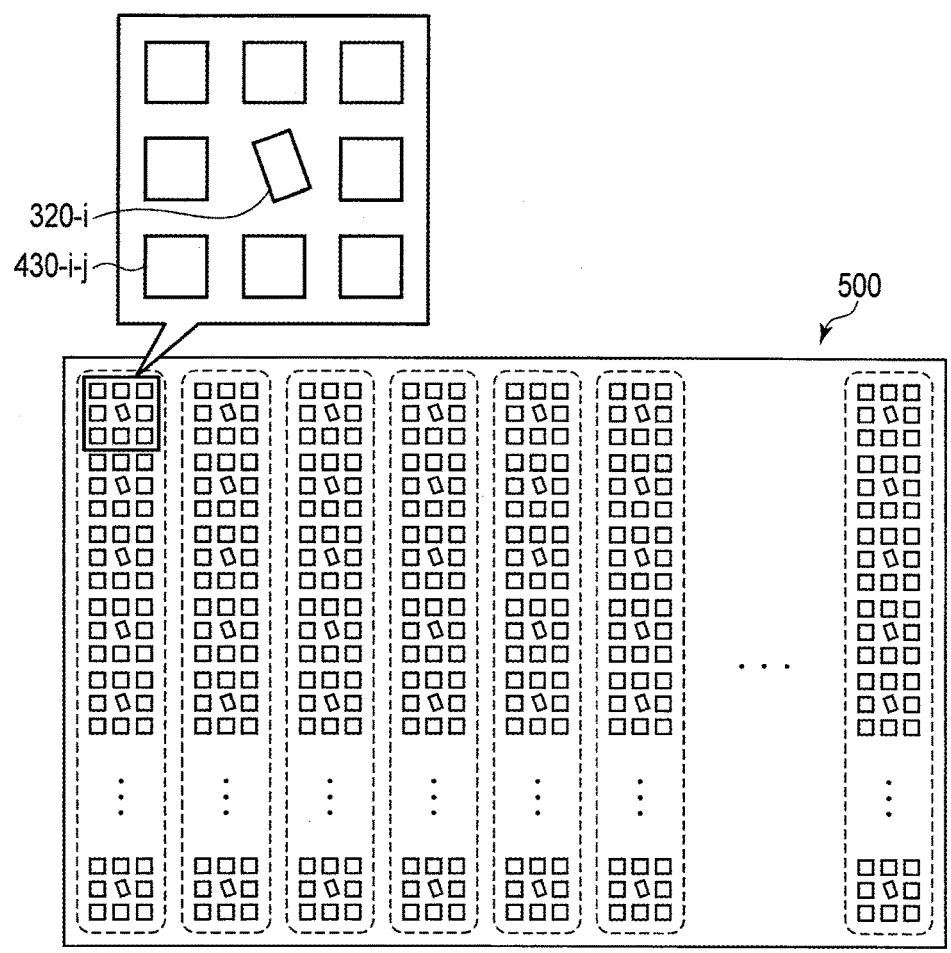
FIG. 7 illustrates a hybrid chip included in a machine learning apparatus according to the fourth embodiment.
Figure 8:
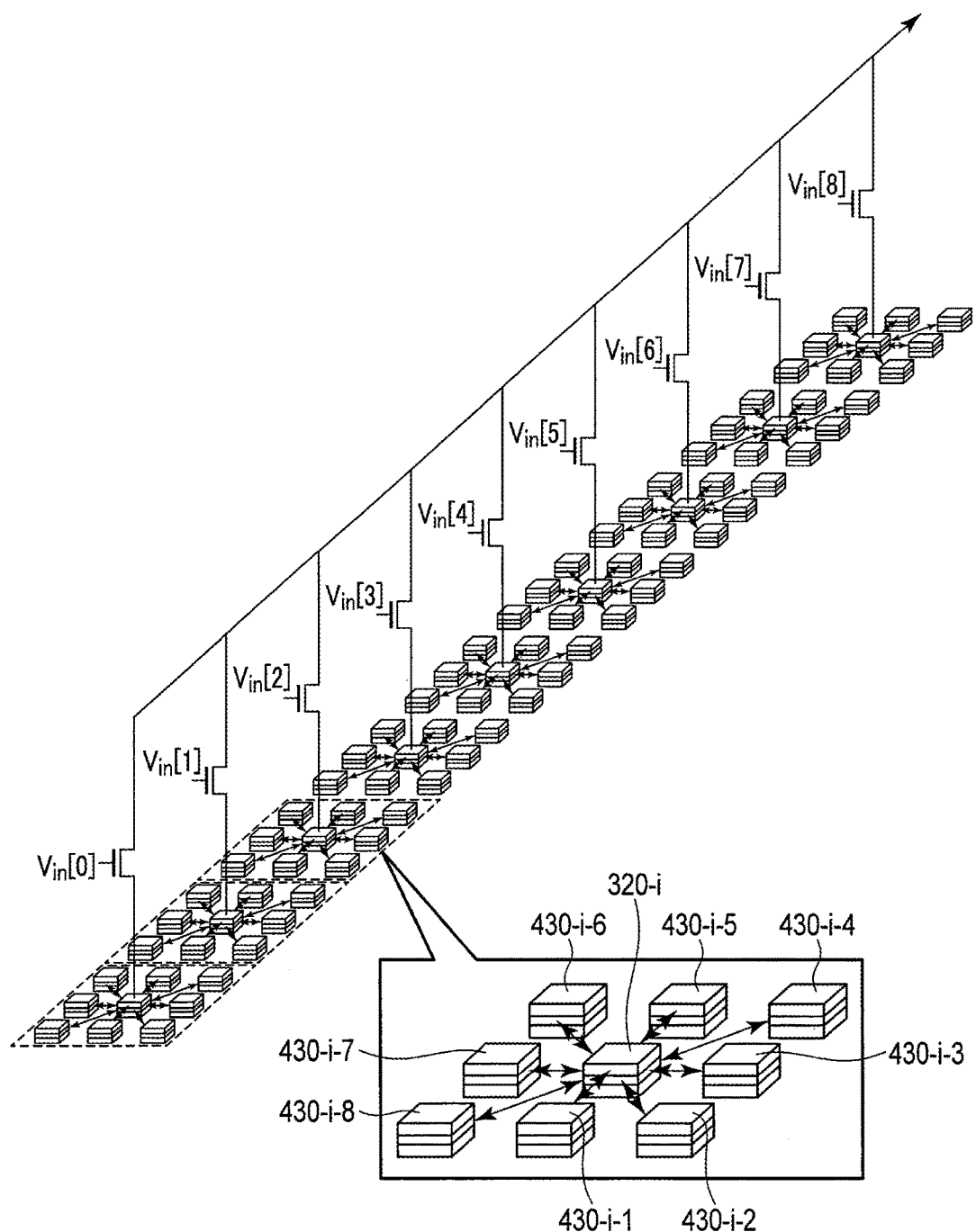
FIG. 8 is a bird's-eye view of the hybrid chip of FIG. 7.

The STO 320 and the eight MRAM cells surrounding the STO 320 may be arranged to form a matrix on the hybrid chip 500 as shown, for example, in FIG. 7. Each column of the matrix may correspond to one coupled oscillator array 140. If all the STOs 320 included in one coupled oscillator array 140 are arranged in one column, it is possible to supply an input current and combine output signals via a common line, as illustrated in FIG. 8. The activation function applier 130 may be arranged in an array form between columns of the matrix, for example, although this is not shown in FIG. 7.

In the case shown in FIG. 8, an N-type metal oxide semiconductor (NMOS) switch (or another type of switch) is inserted between each STO 320 and a common line. For example, the controller 210 controls the gate voltage of each NMOS switch in accordance with the value of the corresponding element of the input vector 11, thereby supplying an appropriate amount of current to the STO 320 connected to the NMOS switch. As a result, each STO 320 receives a current corresponding to the value of one element of the input vector 11.

To sum up, each STO 320 receives a current corresponding to the value of one element of the input vector 11, and receives influence of the stray fields of eight MRAM cells surrounding the STO 320. Accordingly, a current corresponding to the value of one element of the input vector 11 flows through each STO 320, and a stray field corresponding to the value of the learning weight corresponding to the element (i.e., the value of the learning weight by which the element is multiplied) functions. Therefore, the oscillation frequency of each STO 320 varies depending on the value of one element of the input vector 11 and the value of the learning weight corresponding to the element. In the case of FIG. 8, output signals of STOs 320 are combined at the common line, and supplied to the activation function applier 130 (not shown in FIG. 8).

Figure 9:
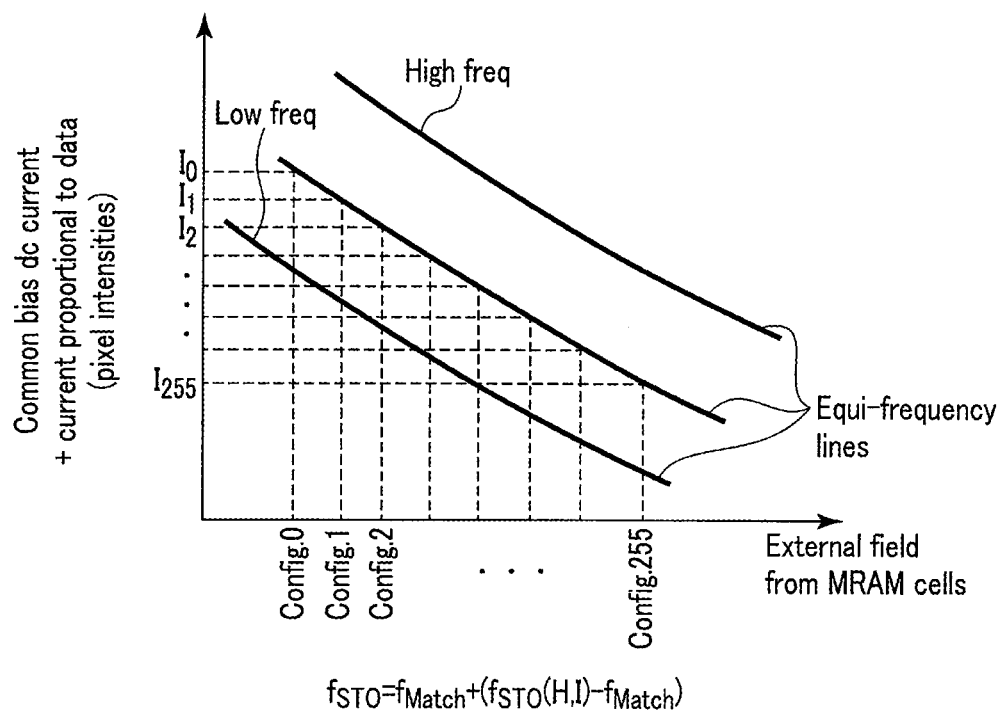
FIG. 9 is a graph illustrating dependency properties of an STO in FIG. 7 on a current and a magnetic field.

Specifically, the oscillation frequency of the STO 320 depends on the (input) current and the (external) magnetic field, as illustrated in FIG. 9. In the graph of FIG. 9, $I_x$ represents the input current of the STO 320 of the case where the element of the input vector 11 is x (x=0, . . . , 255), and config. w represents an external magnetic field that influences the STO 320 when the learning weight corresponding to the element is w (w=0, . . . , 255). In the case of FIG. 9, when the element of the input vector 11 corresponds to the learning weight corresponding to the element (x=w), the oscillation frequency ($f_{STO}$) of the STO 320 is a predetermined matching frequency ($f_{Match}$). In contrast, when x≠w, $f_{STO}$ is shifted to the higher band side or lower band side relative to $f_{Match}$.

For example, when the input vector 11 is (22, 58, 87, 9, 123, 241, 189, 45), and the learning weight vector is (22, 58, 87, 9, 123, 241, 189, 45), the oscillation frequencies of the eight STOs 320 in total are perfectly synchronized, and the matching degree indicated by the calculated signal obtained by combining the output signals is the maximum. In contrast, when the input vector 11 is (22, 58, 87, 9, 123, 241, 189, 45), and the learning weight vector is (1, 58, 2, 9, 123, 3, 189, 45), the oscillation frequencies of the eight STOs 320 in total are not perfectly synchronized, and the matching degree is smaller than the maximum value.

When a 100 GB-size learning weight is stored in the MRAM 430, which is a considerably-large size in comparison with the current multilayer neural network technology, the total size of the hybrid chip 500 of the STO 320 and the MRAM 430 as shown in FIG. 7 can be estimated as follows.

The 100 GB-size learning weight corresponds to approximately six million filters (learning weight matrix) when, for example, the filter size of each layer of an image recognition neural network is 128×128.

Each MRAM cell included in the MRAM 430 stores one-bit of information. Thus, the required number of MRAM cells is 8×100×10⁹. The STO 320 is provided for every eight MRAM cells. When the above-mentioned 6F² design rule is used while assuming the cell size F of the STO 320 and the MRAM 430 is 20 nm, the size of the hybrid chip 500 is estimated by the following formula (5):

$$6 \times (20 \times 10^{-9})^2 \times 9 \times 100 \times 10^9 = (6\sqrt{60} \times 10^{-3})^2 \quad (5)$$
$$\approx (46.5 \times 10^{-3})^2$$

Accordingly, the hybrid chip 500 (eight hundred billion MRAM cells and a hundred billion STOs 320) can be contained in an approximately 4.7 cm square chip. This size is much smaller than the size of the GPU (>25 cm×10 cm×3 cm).

As described above, the machine learning apparatus according to the fourth embodiment includes eight MRAM cells surrounding each STO. Each STO receives learning weights through the stray fields from the surrounding MRAMs. Loading a learning weight without supplying a current corresponding to the value of the learning weight to the STO, this machine learning apparatus can enhance the speed of the multilayer neural network task processing with lower energy consumption.

At least a part of the processing in the above-described embodiments can be implemented using a general-purpose computer as basic hardware. A program implementing the processing in each of the above-described embodiments may be stored in a computer readable storage medium. The program is stored in the storage medium as a file in an installable or executable format. The storage medium is a magnetic disk, an optical disc (CD-ROM, CD-R, DVD, or the like), a magnetooptic disc (MO or the like), a semiconductor memory, or the like. That is, the storage medium may be in any format provided that a program can be stored in the storage medium and that a computer can read the program from the storage medium. Furthermore, the program implementing the processing in each of the above-described embodiments may be stored on a computer (server) connected to a network such as the Internet so as to be downloaded into a computer (client) via the network.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A machine learning apparatus, comprising:
   an interlayer accelerator that comprises a plurality of interlayer units that generate, based on (a) an input vector of a first layer included in a neural network that includes three or more layers and (b) a learning weight matrix of the first layer, an input vector of a second layer next to the first layer; and a magnetoresistive random access memory that stores the learning weight matrix, wherein each of the plurality of interlayer units comprises:

- a coupled oscillator array that includes a plurality of oscillators that oscillate at frequencies corresponding to differences between a plurality of elements of the input vector of the first layer and a plurality of elements of a row vector that is one row of the learning weight matrix, and combines oscillated signals generated by the plurality of oscillators to obtain a calculated signal; and
- an activation function applier that applies an activation function to the calculated signal to generate one element of the input vector of the second layer, the plurality of oscillators include a spin torque oscillator, and the spin torque oscillator is surrounded by eight magnetoresistive random access memory cells.

2. The apparatus according to claim 1, further comprising a controller that controls, for an interlayer calculation between the first layer and the second layer, a number of interlayer units to operate in the interlayer accelerator, a number of oscillators to simultaneously oscillate in a coupled oscillator array in each of the interlayer units, and input signals of the oscillators.

3. The apparatus according to claim 1, wherein the plurality of interlayer units perform parallel operations to generate a plurality of elements of the input vector of the second layer.

4. The apparatus according to claim 1, wherein the plurality of oscillators include a spin torque oscillator.

5. The apparatus according to claim 1, further comprising a non-volatile memory that stores the learning weight matrix.

6. The apparatus according to claim 5, wherein the non-volatile memory includes a magnetoresistive random access memory.

* * * * *